United States Patent [19]

Uemura et al.

[11] Patent Number: 5,278,445
[45] Date of Patent: Jan. 11, 1994

[54] SEMICONDUCTOR DEVICE CARD HAVING A PLURALITY OF SELF-LOCKING PAWLS

[75] Inventors: Shunichi Uemura; Toru Tachikawa; Shigeo Onoda, all of Itami, Japan

[73] Assignee: Mitsubishi Denki Kabushiki Kaisha, Japan

[21] Appl. No.: 588,158

[22] Filed: Sep. 26, 1990

[30] Foreign Application Priority Data

Sep. 27, 1989 [JP] Japan .................. 1-249343

[51] Int. Cl.[5] .................. H01L 23/02; H01L 23/12
[52] U.S. Cl. .................. 257/678; 257/679; 257/922; 235/380; 235/492; 361/728; 361/736; 361/752
[58] Field of Search .................. 235/380, 492; 361/392, 361/395, 399; 357/74, 79, 80; 257/922, 678, 679

[56] References Cited

U.S. PATENT DOCUMENTS

| | | | |
|---|---|---|---|
| 3,668,476 | 6/1972 | Wrabel et al. | 361/395 |
| 4,092,698 | 5/1978 | Bretka | 361/399 |
| 4,149,027 | 4/1979 | Asher et al. | 361/399 |
| 4,226,491 | 10/1980 | Kazama et al. | 361/399 |
| 4,598,962 | 7/1986 | Reitz et al. | 361/399 |
| 4,728,914 | 3/1988 | Morris et al. | 361/395 |
| 4,798,946 | 1/1989 | Fujii et al. | 235/492 |
| 4,843,226 | 6/1989 | Kato et al. | 235/492 |
| 4,868,713 | 9/1989 | Banjo et al. | 361/392 |
| 4,872,087 | 10/1989 | Brant | 361/356 |
| 4,878,154 | 10/1989 | Wang | 361/395 |
| 4,899,257 | 2/1990 | Yamamoto | 361/395 |
| 4,912,602 | 3/1990 | Zurek et al. | 361/399 |
| 4,991,056 | 2/1991 | Shimizu et al. | 361/380 |
| 5,038,250 | 8/1991 | Uenaka et al. | 361/395 |
| 5,053,613 | 10/1991 | Onoda | 235/492 |

FOREIGN PATENT DOCUMENTS 225096 1/1990 Japan .

*Primary Examiner*—Rolf Hille
*Assistant Examiner*—David Ostrowski
*Attorney, Agent, or Firm*—Leydig, Voit & Mayer

[57] ABSTRACT

A semiconductor device card includes an electric circuit board, at least one panel having self-locking pawls formed at several places along the edge thereof, and a frame having engagement surfaces for engaging the pawls.

11 Claims, 3 Drawing Sheets

SEMICONDUCTOR DEVICE CARD HAVING A PLURALITY OF SELF-LOCKING PAWLS

BACKGROUND OF THE INVENTION

1. Field of the Invention

The present invention relates to a panel assembly structure of a semiconductor device card.

2. Description of the Related Art

FIG. 1 is a perspective view illustrating conventional semiconductor device card. FIG. 2 is a schematic cross-sectional view taken along the line II—II of FIG. 1. A semiconductor device card 1 comprises an electric circuit board 2 having a plurality of electric circuit elements, e.g., semiconductor storage elements 3, mounted on both the obverse and reverse main surfaces thereof, housed in a case formed by a frame 4, and an obverse panel 5a and a reverse panel 5b which are fitted into the upper and lower sections of this frame. The edges of the electric circuit board 2 are supported and fixed by a supporting section 4a formed inside the frame 4 which surrounds the four sides of the electric circuit board 2. On the outer side of the frame 4, a plurality of terminals 6 which are used to electrically connect the semiconductor storage element 3 to the outside of the card are disposed.

The obverse panel 5a and the reverse panel 5b are used to protect the semiconductor storage element 3 from both the top and bottom sides. The obverse panel 5a and the reverse panel 5b are each fitted in the recessed sections 4b formed inside the upper and lower sections of the frame 4, and are fixed with an adhesive sheet such as double-sided tape, or an adhesive agent (both not shown).

Since the conventional semiconductor device card is constructed as described above, there exists a problem in that the strength of bonding between the obverse and reverse panels and the frame depends on an adhesive sheet or an adhesive agent, thus the strength of bonding is not uniform and varies widely, resulting in low reliability.

SUMMARY OF THE INVENTION

The present invention has been devised to eliminate the above-mentioned problem. An object of the present invention is to improve the bonding force between the obverse and reverse panels and the frame and to obtain a fixed bonding force at all times.

To this end, according to the present invention, there is provided a semiconductor device card comprising: an electric circuit board on which electric circuit elements and the like are mounted; a frame which surrounds the edges of the electric circuit board, and which supports the electric circuit board; a panel which is fitted into the frame and which covers the electric circuit board; a plurality of pawls each having a self-locking function, formed on the edge of and projecting substantially at right angles to the panel; and an engagement section which is disposed on the frame in correspondence with the position of each of the pawls for locking each of the pawls to fix the panel to the frame.

In the present invention, when a panel is engaged with a frame, pawls formed at several positions on the edge of each panel are engaged with engagement surfaces formed in the frame to lock the panel in the frame.

These and other objects, features and advantages of the present invention will become clear when reference is made to the following description of the preferred embodiments of the present invention, together with reference to the accompanying drawings.

DESCRIPTION OF THE PREFERRED EMBODIMENTS

Figure 1:
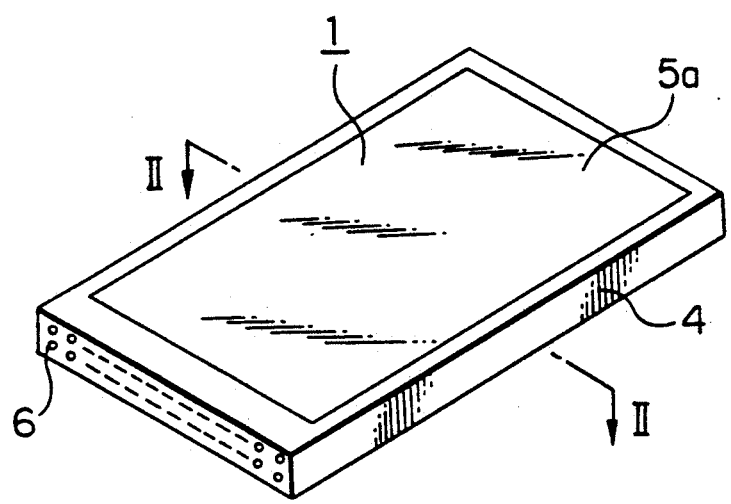
FIG. 1 is a perspective view illustrating the exterior of a conventional semiconductor device card.
Figure 2:
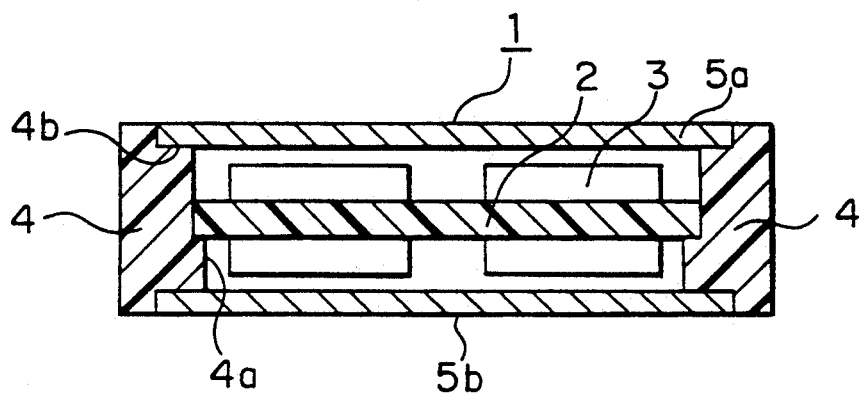
FIG. 2 is a cross sectional view of the semiconductor device card taken along the line II—II of FIG. 1.
Figure 3:
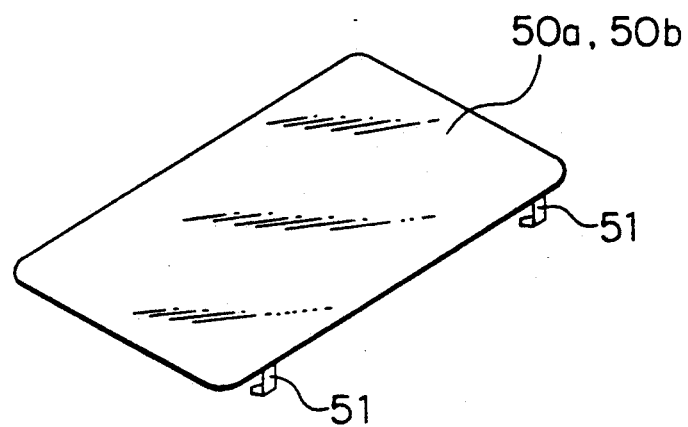
FIG. 3 is a perspective view illustrating a panel for the semiconductor device card according to an embodiment of the present invention.
Figure 4:
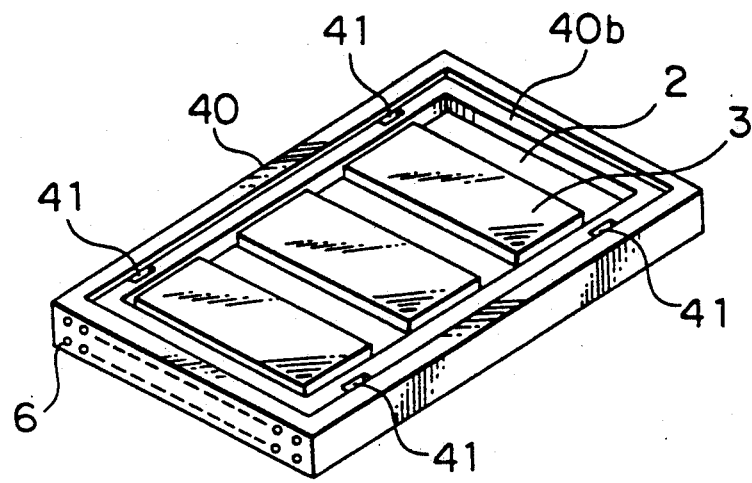
FIG. 4 is a perspective view illustrating the frame for the semiconductor device card according to an embodiment of the present invention to which the panel of FIG. 3 is fitted.

An embodiment of the present invention will be explained hereinunder with reference to the accompanying drawings. FIG. 3 is a perspective view illustrating an obverse or reverse panel for a semiconductor device card in accordance with one embodiment of the present invention. FIG. 4 is a perspective view illustrating a frame according to one embodiment of the present invention. Parts identical to those parts of the prior art are designated by the same reference characters.

Figure 5:
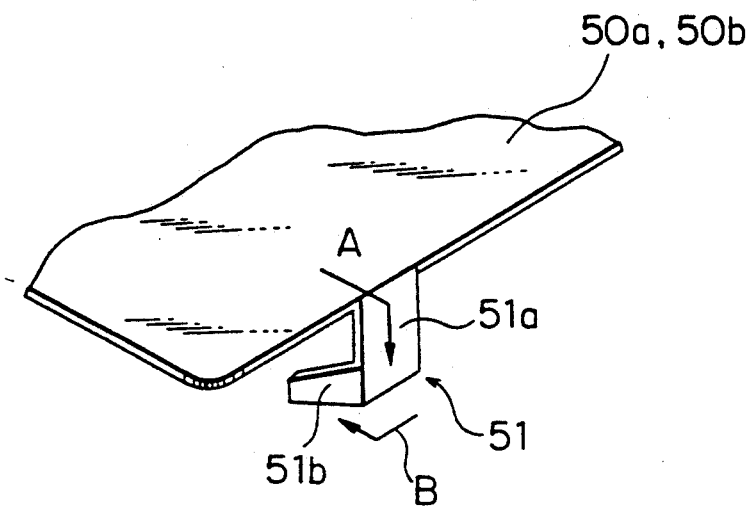
FIG. 5 is an enlarged perspective view illustrating the pawl sections formed on the panel of FIG. 3.
Figure 8:
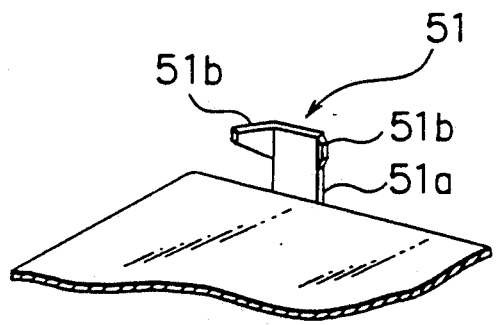
FIG. 8 is a perspective view illustrating another embodiment of the pawl section formed on the panel of the semiconductor device card according to a second embodiment of the present invention.

As shown in FIG. 3, a plurality of pawl sections 51 (in this embodiment, a total of four—two on each side) are formed on the obverse and reverse panels 50a and 50b. FIG. 5 is an enlarged view of one of the pawl sections 51. The pawl section 51 includes a trunk section 51a extending substantially perpendicular to the panel surface on the back side of the panels 50a and 50b, and a self-locking pawl 51b protruding substantially at right angles to the longitudinal direction of the trunk section 51a. In this embodiment, the pawl section 51 is integrally formed with the panels 50a and 50b, and consists of an L-shaped member of a resilient thin metal (e.g., stainless type metal) which is bonded or soldered to the panel. This L-shaped member is bent toward the back side of the panels 50a and 50b, as shown by an arrow A. Furthermore, the pawl section 51 includes a self-locking pawl tongue 51b at the front end which is bent toward the inside of the panel with the longitudinal direction of the trunk section 51a as an axis, as shown by an a₁ - v B. The pawl section 51 may be formed in such a w that the self-locking pawl tongue 51b is formed on both sides of the trunk section 51a as shown in FIG. 8.

Figure 6:
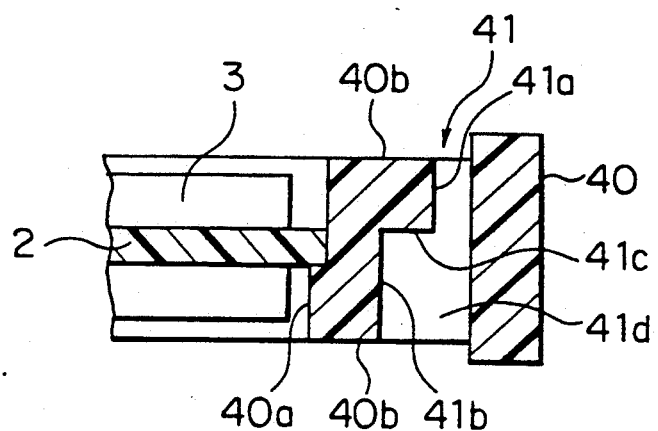
FIG. 6 is an enlarged cross-sectional view illustrating an engagement section formed on the frame of FIG. 4.

In FIG. 4, the electric circuit board 2, on which the semiconductor storage elements 3 are mounted, is supported and fixed by the support 40a (See FIG. 6) formed in the center of the inside of a frame 40. On the inside of each of the upper and lower sections of the frame 40, a recessed section 40b is formed, into which a respective panel is fitted so that the height of the surface of the panel becomes equal to that of the surface of the frame 40 when the panels 50a and 50b are mounted in the frame 40. An engagement section 41 is formed at a position corresponding to the position of each of the pawl sections 51 of the panel inside the recessed section 40b of the frame 40. FIG. 6 is an enlarged cross-sectional view illustrating one of the engagement sections 41. Referring to the Figures, the engagement sections 41 comprises an engagement surface 41c formed between a narrow hole section 41a and a wide hole section 41b respectively formed along respective sides of the frame 40. The wide hole section 41b extends in the same direction as the direction in which the self-locking pawl 51b of the pawl section 51 protrudes. An engagement hole 41d passes between the recessed sections 40b of the upper and lower sections of the frame 40. Accordingly, the positions of the pawl sections 51 but the panels 50a and 50b must be offset from each other so that they do not coincide.

Figure 7:
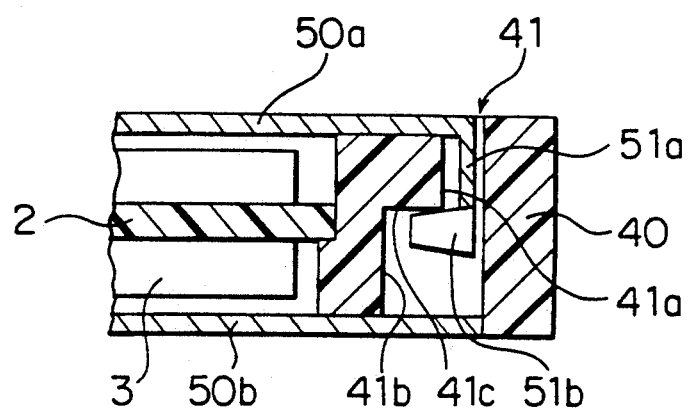
FIG. 7 is a cross sectional view illustrating pawl section of FIG. 5 engaged with the engagement section of FIG. 6.

When the panels 50a and 50b are fitted to the frame 40, the pawl section 51 is inserted into the engagement hole 41d with the self-locking pawl tongue 51b of the pawl section 51 extended in conformity with the shape of the narrow hole section 41a of the engagement hole 41d. When the pawl section 51 is inserted through the narrow hole 41a as far as possible, the self-locking pawl 51b reaches the wide hole section 41b, allowing the self-locking pawl tongue 51b to be released. Owing to its elasticity, the pawl tongue 51b returns to its original state in which it locks itself inside the frame 40. Consequently, as shown in FIG. 7, the self-locking pawl 51b is locked onto the engagement surface 41c of the wide hole section 41b, preventing the pawl section 51 from slipping out. As a result, the panels 50a and 50b are each fitted and fixed to the frame 40.

In the embodiment described above, a semiconductor device card of a type such that a panel is fitted to each of the upper and lower sections of a frame was explained. The present invention can be applied to a card of the type in which a frame covers one side of an electric circuit board and a panel is fitted into only the other side of the board with the same effect as described above.

In the embodiment described above, regarding a pawl section and an engagement section, a case where a self-locking pawl on the front end of the pawl section formed on a panel protrudes toward the inside of the panel was explained. The present invention is not limited to this. The present invention may be formed in an arrangement in which, when a pawl section is inserted into a predetermined position of an engagement hole, a self-locking pawl on the front end of the pawl section is locked to a part of a frame, thus preventing the pawl section from returning to its original position.

A panel and a frame may be mechanically fixed by applying the present invention, and at the same time the section between a panel and a frame may be fixed with an adhesive agent or the like as in the prior art.

As has been explained above, according to the present invention, since the pawl sections on the obverse and reverse panels are engaged with and fixed to the engagement section of a frame, it is difficult for each panel to separate from the frame and the panel can be fixed to the frame more stably.

Many widely different embodiments of the present invention can be made without departing from the spirit and scope thereof, therefore, it is to be understood that this invention is not limited to the specific embodiments described but is defined in the appended claims.

What is claimed is:

1. A semiconductor device card comprising:
   an electric circuit board on which electric circuit elements are mounted, said board including edges;
   a frame surrounding and supporting said electric circuit board at the edges;
   a panel fitted to said frame covering said electric circuit board;
   a plurality of self-locking pawls projecting at substantially right angles from said panel; and
   an engagement section in said frame receiving and locking each of said pawls, fixing said panel to said frame, wherein each pawl is formed of a resilient material and comprises a trunk having a longitudinal axis extending substantially perpendicular to said panel and two self-locking pawl tongues protruding substantially at right angles to the longitudinal axis of said trunk, said pawl tongues being resiliently deflected about respective axes generally parallel to the longitudinal axis of the respective trunks from original positions by the engagement section of said frame while each of said pawls is being respectively inserted into the engagement section and interlocking with the engagement section by resiliently returning to the respective original positions when the engagement section fully receives said pawls.

2. A semiconductor device card comprising:
   an electric circuit board on which electric circuit elements are mounted, said board including edges;
   a frame surrounding and supporting said electric circuit board at the edges;
   a panel fitted to said frame covering said electric circuit board;
   a plurality of self-locking pawls projecting at substantially right angles from said panel; and
   an engagement section in said frame receiving and locking each of said pawls, fixing said panel to said frame, wherein each pawl is formed of a resilient material and comprises a trunk extending substantially perpendicular to said panel and two self-locking pawl tongues, said self-locking pawl tongues protruding from opposite sides of said trunk substantially at right angles to said trunk, and wherein said engagement section comprises a plurality of engagement holes in said frame, each engagement hole including a relatively narrow hole for receiving one of said pawl trunks and a relatively wide hole for receiving said self-locking pawl tongues protruding from said trunk, said self-locking pawl tongues being resiliently deflected from respective original positions by the engagement section of said frame while each of said pawls is being inserted into said engagement section and interlocking with the engagement section by resiliently returning said self-locking pawl tongues to their respective original positions when said engagement section fully receives said pawls whereby said panel is fixed to said frame.

3. The semiconductor device card as claimed in claim 2 wherein each of said relatively wide holes expands in a direction toward said board at the part of the relatively narrow hole closest to said board.

4. The semiconductor device card as claimed in claim 1 comprising an adhesive agent bonding said frame and said panel together.

5. The semiconductor device card as claimed in claim 3 wherein said engagement holes extend entirely through said frame.

6. The semiconductor device card as claimed in claim 2 wherein said frame includes an inner edge and a recess on the inner edge of said frame for receiving said panel so that said panel and frame are flush when said panel engages said frame.

7. The semiconductor device card as claimed in claim 1 including two panels engaging said frame on opposite sides of said electric circuit board.

8. The semiconductor device card as claimed in claim 1 where said frame covers one side of said electric circuit board and said panel covers an opposite side of said circuit board therein.

9. The semiconductor device card as claimed in claim 1 including a plurality of terminals electrically connected to said electric circuit elements wherein said plurality of terminals are disposed on said frame.

10. A semiconductor device card comprising:
   an electric circuit board on which electric circuit elements are mounted, said board including edges;
   a frame surrounding and supporting said electric circuit board at the edges;
   a panel fitted to said frame covering said electric circuit board;
   a plurality of self-locking pawls projecting at substantially right angles from said panel; and
   an engagement section in said frame receiving and locking each of said pawls, fixing said panel to said frame, wherein each pawl is formed of a resilient material and comprises a trunk extending substantially perpendicular to said panel and two self-locking pawl tongues, said self-locking pawl tongues protruding from opposite sides of said trunk substantially at right angles to said trunk, and wherein said engagement section comprises a plurality of engagement holes in said frame, each engagement hole including a relatively narrow hole for receiving one of said pawls so that said frame resiliently deflects said self-locking pawl tongues from respective original positions during insertion of said pawls into said engagement section and a relatively wide hole for receiving said self-locking pawl tongues and allowing said self-locking pawl tongues resiliently deflected by said frame to return to their respective original positions when said relatively wide hole fully receives said pawl whereby said engagement section interlocks with each of said pawls and said panel is fixed on said frame.

11. The semiconductor device card as claimed in claim 10 wherein each trunk has a longitudinal axis extending substantially perpendicular to said panel and said self-locking pawl tongues are resiliently deflected about respective axes generally parallel to the longitudinal axis of the respective trunk by said frame at the corresponding relatively narrow hole during insertion of said pawls into said engagement section.

* * * * *